United States Patent
Pushp

(10) Patent No.: US 10,770,649 B1
(45) Date of Patent: Sep. 8, 2020

(54) LATTICE MATCHED TUNNEL BARRIERS FOR PERPENDICULARLY MAGNETIZED HEUSLER ALLOYS

(71) Applicant: INTERNATIONAL BUSINESS MACHINES CORPORATION, Armonk, NY (US)

(72) Inventor: Aakash Pushp, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/281,642

(22) Filed: Feb. 21, 2019

(51) Int. Cl.
| H01L 43/00 | (2006.01) |
| H01L 29/82 | (2006.01) |
| H01L 43/02 | (2006.01) |
| G11C 11/16 | (2006.01) |
| H01L 43/12 | (2006.01) |
| H01L 43/10 | (2006.01) |

(52) U.S. Cl.
CPC ............ *H01L 43/02* (2013.01); *G11C 11/161* (2013.01); *H01L 43/10* (2013.01); *H01L 43/12* (2013.01)

(58) Field of Classification Search
CPC ......... H01L 43/08; H01L 43/02; H01L 43/12; H01L 43/10; H01L 41/12; G11C 11/161; G11C 2211/5615
USPC ....................................................... 257/421
See application file for complete search history.

(56) References Cited

U.S. PATENT DOCUMENTS

| 7,804,667 B2 | 9/2010 | Hirata et al. |
| 8,199,565 B2 | 6/2012 | Clinton et al. |
| 9,496,490 B2 * | 11/2016 | Boeve ................ H01L 27/2472 |
| 9,634,241 B2 | 4/2017 | Butler et al. |
| 2013/0082798 A1 * | 4/2013 | Wang ...................... G11B 5/66 333/147 |
| 2017/0140784 A1 | 5/2017 | Sukegawa et al. |

FOREIGN PATENT DOCUMENTS

| JP | 2009239122 A | 10/2009 |
| WO | 2018125210 A1 | 7/2018 |

OTHER PUBLICATIONS

Scheike, T. et al., "Lattice-matched magnetic tunnel junctions using a Heusler alloy Co2FeAl and a cation-disorder spinel Mg—Al—O barrier," Applied Physics Letters, 105, 242407, Dec. 17, 2014, 6 pages.

(Continued)

*Primary Examiner* — Theresa T Doan
(74) *Attorney, Agent, or Firm* — Schmeiser, Olsen & Watts, LLP; Daniel Johnson

(57) ABSTRACT

A device comprising a first magnetic layer (e.g., $Co_2MnSi$ Heusler alloy or a tetragonally distorted perpendicularly magnetized (PMA) Heusler alloy such as $Mn_3Ga$, $Mn_3Ge$, etc.) and a second magnetic layer (e.g., $Co_2MnSi$ Heusler alloy or a tetragonally distorted perpendicularly magnetized (PMA) Heusler alloy such as $Mn_3Ga$, $Mn_3Ge$, etc.), and a metal halide tunnel barrier in between the first and second magnetic layers, wherein the metal halide tunnel barrier (e.g., NaF, NaCl, NaBr, LiF, LiCl, and LiBr or their combination) is lattice matched within a predetermined limit (e.g. 5%) of both the first and second magnetic layers.

26 Claims, 9 Drawing Sheets

(56) References Cited

OTHER PUBLICATIONS

Zhang, J. et al., "Spinel oxides: Δ1 spin-filter barrier for a class of magnetic tunnel junctions," Applied Physics Letters, 100, 222401, May 29, 2012, 5 pages.

Cabailh, G. et al., "Thin NaCl films on silver (001): island growth and work function," New Journal of Physics, 14, Oct. 23, 2012, 19 pages.

Kiguchi, M. et al., Heteroepitaxial growth of LiCl on Cu(001), Physical Review B, 63, May 3, 2001, 6 pages.

Tsunegi, S. et al., "Large tunnel magnetoresistance in magnetic tunnel junctions using a Co2MnSi Heusler alloy electrode and a Mgo barrier," Applied Physics Letters, 93, Sep. 18, 2008, 4 pages.

Zhang, J. et al., "Bias dependence of spin transfer torque in Co2MnSi Heusler alloy based magnetic tunnel junctions," Applied Physics Letters, 110, Apr. 26, 2017, 6 pages.

* cited by examiner

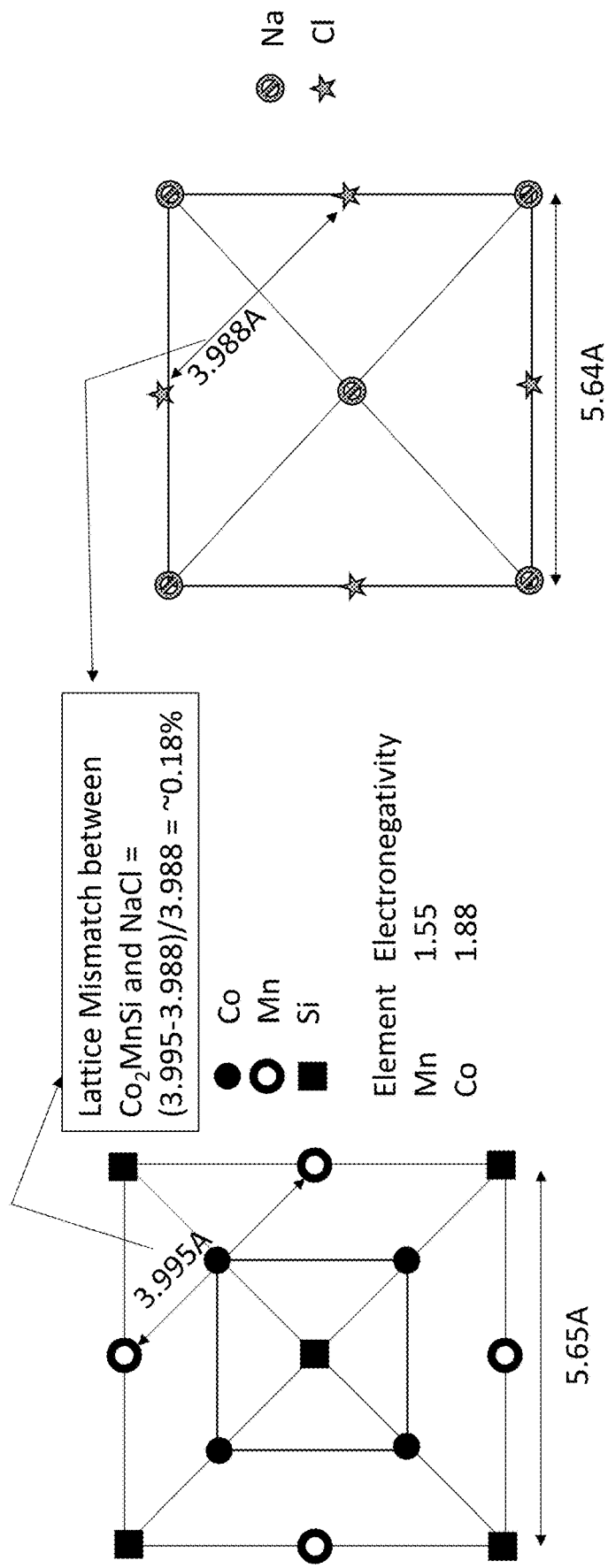

US 10,770,649 B1

LATTICE MATCHED TUNNEL BARRIERS FOR PERPENDICULARLY MAGNETIZED HEUSLER ALLOYS

BACKGROUND OF THE INVENTION

Field of Invention

The present invention relates generally to the field of tunnel barriers. More specifically, the present invention is related to the use of a halide tunnel barrier that is lattice matched to perpendicularly magnetized Heusler alloys.

Discussion of Related Art

MgO is the standard tunnel barrier for Magnetic Tunnel Junctions (MTJs) that are essential for STT-MRAM (Spin Transfer Torque-Magnetic Random Access Memory) since it enhances the spin polarization of the magnetic electrodes along its 001 orientation due to spin-filtering effect.

On the other hand, cubic Heusler alloys (for example $Co_2MnSi$, $Co_2FeSi$, etc.) have already demonstrated exceptionally high spin polarization as MTJ electrodes due to their half-metallic properties, regardless of the choice of tunnel barriers (high spin polarization has been demonstrated for amorphous $AlO_x$ tunnel barriers as well as crystalline MgO tunnel barriers).

Perpendicularly magnetized anisotropy (PMA) materials are essential for scaling STT-MRAM technology beyond 30 nm. Several tetragonally distorted Heusler alloys naturally exhibit PMA. However, these tetragonally distorted Heusler alloys do NOT exhibit half-metallic behavior and thus will require proper choice of tunnel barriers in order to offer high spin-polarization leading to large tunneling magnetoresistance (TMR).

Tsunegi et al. in their paper titled "Large Tunnel Magnetoresistance in Magnetic Tunnel Junctions Using a $Co_2MnSi$ Heusler Alloy Electrode and a MgO Barrier" disclose that a large tunnel magnetoresistance (TMR) ratio of 753% has been observed at 2 K in a magnetic tunnel junction (MTJ) using a $Co_2MnSi$ Heusler alloy electrode and a crystalline MgO tunnel barrier. Tsunegi et al. report that the observed TMR ratio is the largest reported to date in MTJs using a Heusler alloy electrode. Tsunegi et al. also report a large TMR ratio of 217% that is observed at room temperature (RT), wherein this TMR at RT is much larger than that of MTJs using an amorphous Al-oxide tunnel barrier. It is further noted within the paper that the temperature dependence of the TMR ratio is still large because of inelastic tunneling in the antiparallel magnetic configuration.

Zhang et al. in their paper titled "Bias Dependence of Spin Transfer Torque in $Co_2MnSi$ Heusler Alloy Based Magnetic Tunnel Junctions" investigate the bias dependence of the anti-damping like and field-like spin transfer torque components in both symmetric ($Co_2MnSi/MgO/Co_2MnSi$) and asymmetric ($Co_2MnSi/MgO/CoFe$) structure Heusler-based MTJs using spin transfer torque ferromagnetic resonance. It is noted in this paper that while the damping like torque is linear with respect to bias for both MTJ structures, the asymmetric MTJ structure has an additional linear component to the ordinarily quadratic field like torque bias dependence and that these results can be accounted for by a free electron tunneling model. It is further noted in this paper that the low damping and low saturation magnetization properties of Heusler alloys are more likely to lead significant improvements to spin torque switching efficiency rather than their half metallic character.

As noted above, $Co_2MnSi$—MgO tunneling interface is well studied in the prior art. FIGS. 1A-D depict the lattice structures of such a $Co_2MnSi|MgO$ tunneling interface. FIGS. 1A-B illustrate the lattice mismatch between $Co_2MnSi$ and MgO (with respect to MgO) to be (3.995−4.212)/4.212=−5.15%. FIGS. 1C and 1D illustrate the oxygen (O) on cobalt (Co) and O on manganese (Mn) lattice structures, respectively. Even in the preferred configuration of O on Mn, where O is bonded with Mn, there is a 5% strain at the interface because of lattice mismatch, because the Mn—Mn distance=3.996 Å in $Co_2MnSi$, whereas the O—O distance is 4.212 Å in MgO.

Cabailh et al. in their paper titled "Thin Film NaCl Growth in Ag Sub-Surface Using Evaporation" study the surface work function (WF) and substrate temperature dependence of the NaCl thin-film growth on Ag(001) using noncontact atomic force microscopy and Kelvin probe force microscopy. In Cabailh et al., the NaCl film is composed of large crystalline islands in the sub-monolayer range, where such islands decrease in density and increase in size with increasing temperature during deposition. Each island in Cabailh et al. is composed of a large base island 2 monolayers (ML) thick (for T>343 K), which collects impinging NaCl molecules that form ad-islands on top. Kelvin probe force microscopy (KPFM) measurements in Cabailh et al. show a reduction of the silver WF by $\Delta q=\varphi_{Ag}-\varphi_{NaCl/Ag}=$ 0.69±0.03 eV with no dependence on the film thickness (1-6 ML), in agreement with recent theoretical calculations.

Kiguchi et al. in their paper titled "Thin Film LiCl Growth on Cu Sub-Surface Using Evaporation" study the growth of thin film LiCl on a Cu(001) substrate using reflection high-energy electron diffraction and Auger electron spectroscopy. Kiguchi et al. noted that at a substrate temperature of 300 K, a single-domain LiCl film ($[100]_{film}//[110]_{substrate}$) grows in a layer-by-layer fashion, while a double-domain LiCl film ($[100]_{film}//[100]_{substrate}$ and $[100]_{film}//[110]^{substrate}$) grows at substrate temperatures higher than 470 K.

Embodiments of the present invention are an improvement over prior art systems and methods.

SUMMARY OF THE INVENTION

In one embodiment, the present invention provides a device comprising a first magnetic layer (e.g., $Co_2MnSi$ Heusler alloy or a tetragonally distorted perpendicularly magnetized (PMA) Heusler alloy) and a second magnetic layer (e.g., $Co_2MnSi$ Heusler alloy or a tetragonally distorted perpendicularly magnetized (PMA) Heusler alloy), and a metal halide tunnel barrier (e.g., NaF, NaCl, NaBr, LiF, LiCl, and LiBr) in between the first and second magnetic layers, wherein the halide tunnel barrier is lattice matched to within 5% of both the first and second magnetic layers, and wherein the first layer, the second layer, and the tunnel barrier are in proximity with each other so that spin-polarized current can pass from one of the magnetic layers to the other of the magnetic layers.

In another embodiment, the present invention provides a method comprising: depositing a first magnetic layer (e.g., $Co_2MnSi$ Heusler alloy or a tetragonally distorted perpendicularly magnetized (PMA) Heusler alloy); epitaxially growing a metal halide tunnel barrier (e.g., NaF, NaCl, NaBr, LiF, LiCl, and LiBr) on top of the first magnetic layer, and depositing a second magnetic layer (e.g., $Co_2MnSi$ Heusler alloy or a tetragonally distorted perpendicularly magnetized (PMA) Heusler alloy) on top of the epitaxially grown metal halide tunnel barrier, wherein the metal halide tunnel barrier is lattice matched to within 5% of both the first and second magnetic layers.

In yet another embodiment, the present invention provides a device comprising: a first magnetic layer (e.g., $Co_2MnSi$ Heusler alloy or a tetragonally distorted perpendicularly magnetized (PMA) Heusler alloy); a metal halide tunnel barrier underlying the first magnetic layer; and a second magnetic layer (e.g., $Co_2MnSi$ Heusler alloy or a tetragonally distorted perpendicularly magnetized (PMA) Heusler alloy) underlying the tunnel barrier, wherein the first magnetic layer, the metal halide tunnel barrier, and the second magnetic layer are in proximity with each other, such that they form a magnetic tunnel junction, the metal halide tunnel barrier is composed of any one of or a combination of NaF, NaCl, NaBr, LiF, LiCl, and LiBr, and at least one of the magnetic layers is formed from a Heusler alloy.

In another embodiment, the present invention provides a method comprising: depositing a first magnetic layer made of a tetragonally distorted perpendicularly magnetized (PMA) Heusler alloy; epitaxially growing a metal halide tunnel barrier on top of the first magnetic layer, the metal halide tunnel barrier composed of any one of or a combination of NaF, NaCl, NaBr, LiF, LiCl, and LiBr, and depositing a second magnetic layer made of a tetragonally distorted perpendicularly magnetized (PMA) Heusler alloy on top of the epitaxially grown metal halide tunnel barrier, wherein the metal halide tunnel barrier is lattice matched to within 5% of both the first and second magnetic layers.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

FIGS. 2A and 2B illustrate the lattice mismatch between $Co_2MnSi$ and NaCl (with respect to NaCl) to be about 0.18%.

DESCRIPTION OF THE PREFERRED EMBODIMENTS

Figures 1A, 1B:
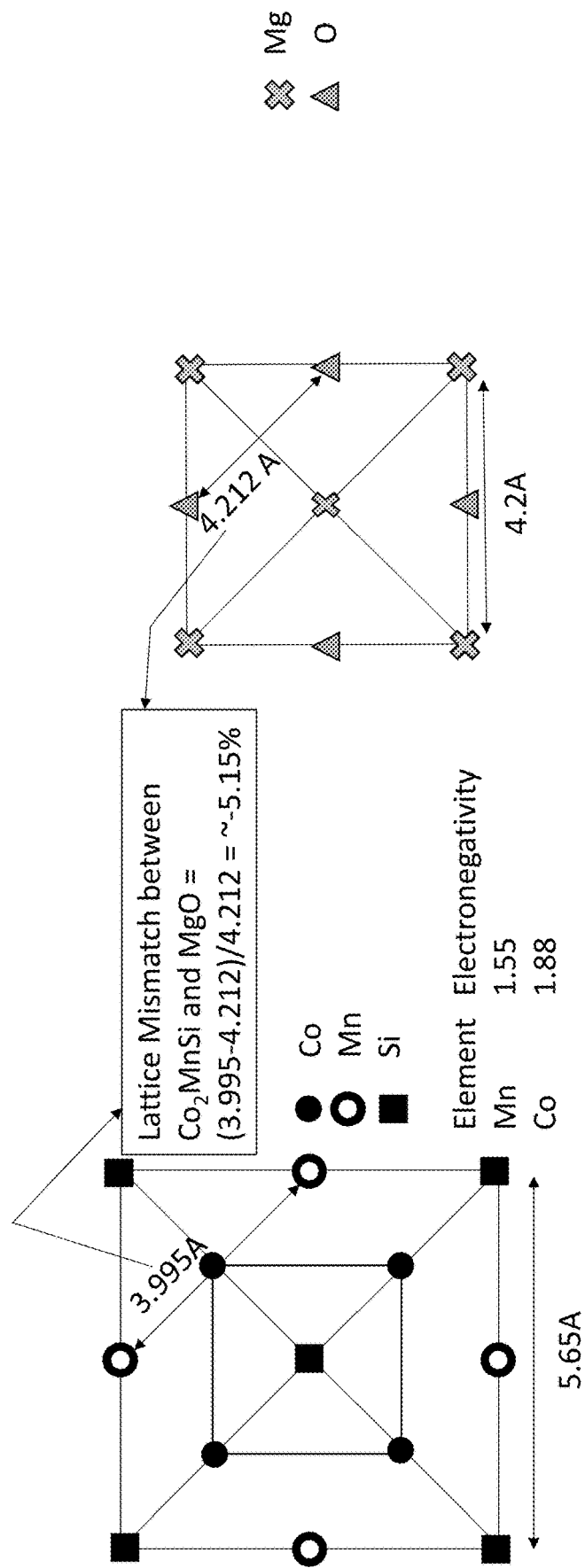
FIGS. 1A and 1B illustrate the lattice mismatch between $Co_2MnSi$ and MgO (with respect to MgO) to be about 5.15%.
Figure 1C:
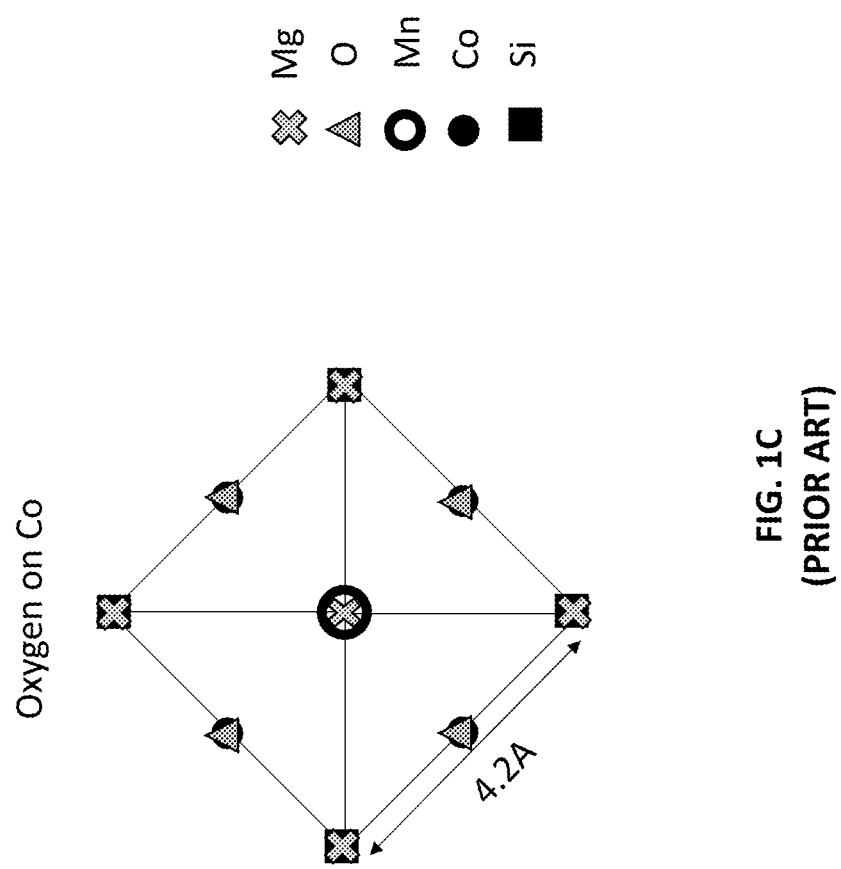
FIGS. 1C and 1D illustrate the oxygen (O) on cobalt (Co) and O on manganese (Mn) lattice structures, respectively.
Figure 1D:
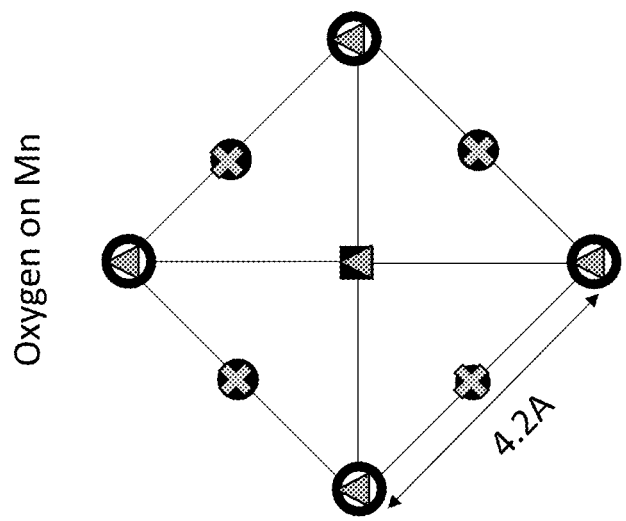

While this invention is illustrated and described in preferred embodiments, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

FIGS. 2A-B illustrate the lattice structures of a non-limiting example of a $Co_2MnSi|NaCl$ tunneling interface. According to the present invention, the best choice for tunnel barrier for PMA Heusler alloys that offer spin filtering properties are rock salt structures such as NaCl, LiCl, NaF, etc. and combinations thereof in their <001> orientation. FIGS. 2A-B depict an example lattice structure of the $Co_2MnSi|NaCl$ tunneling interface that may be used between two magnetic layers. FIGS. 2A-B illustrate the lattice mismatch between $Co_2MnSi$ and NaCl (with respect to NaCl) to be $(3.995-3.988)/3.988 = \sim0.18\%$ (significantly lower than the lattice mismatch that was shown in FIGS. 1A-B). The lattice constant of $Co_2MnSi$ is 5.65 Å, whereas the lattice constant of NaCl is 5.64 Å. NaCl is the classic rock salt structure, the same symmetry as that of MgO. It is because of this symmetry that the 001 orientation of a rock salt structure should offer spin-filtering and, thus, a high TMR.

Figure 7D:
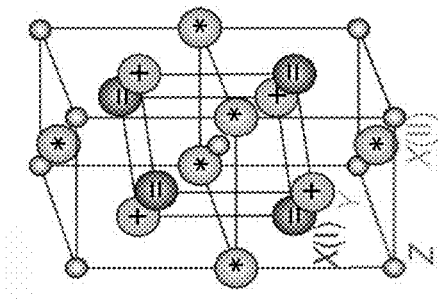
FIGS. 7A through 7D depict a regular cubic Heusler structure, regular tetragonal Heusler structure, inverse cubic Heusler structure, inverse tetragonal Heusler structure, respectively.
Figure 7C:
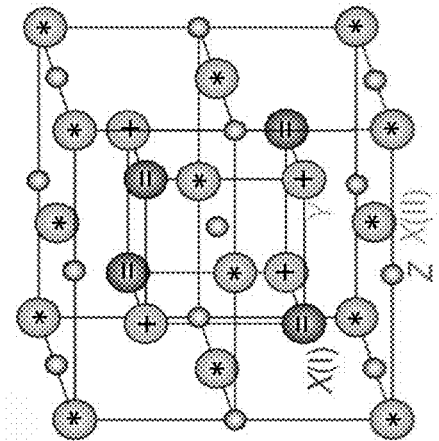
Figure 7B:
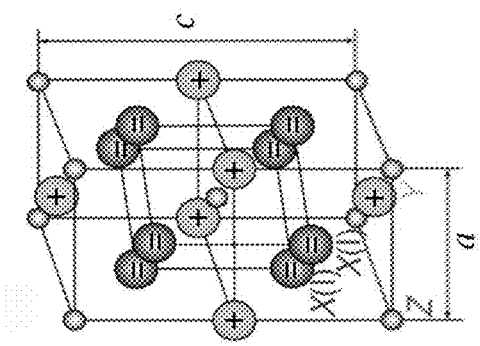
Figure 7A:
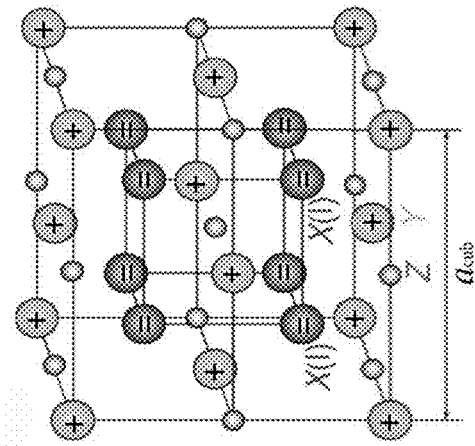

FIGS. 7A-D depict a regular cubic Heusler structure, regular tetragonal Heusler structure, inverse cubic Heusler structure, inverse tetragonal Heusler structure, respectively. The cubic Heusler compounds $X_2YZ$ can have regular or inverse structure, as shown in FIGS. 7A and 7C, with four sites that form four FCC sublattices—site Z (occupied by atom Z), site II that is octahedrally coordinated by Z, and two equivalent sites I that are tetrahedrally coordinated by Z. In the regular structure in FIG. 7A, two X atoms (circle with "=" within labeled X(I)) have identical environments—they are located in sites I in the same x-y plane. In this structure, the Y atom (circle with "+" within) in site II and the Z atom (smallest circle that is gray) are located in another x-y plane. In the inverse structure shown in FIG. 7C, two X atoms have different environments—one X atom (circle with "=" within and labeled X(I)) is located in site I in one x-y plane with a Y atom (circle with "+ within), while another X atom [circle with "*" within and labeled X(II)] is located in site II in another x-y plane with a Z atom (smallest circle that is gray). Regular (FIG. 7B) and inverse (FIG. 7D) tetragonal Heusler structures can be obtained from regular and inverse cubic structures, respectively, by stretching (or compressing) parent cubic structure along the z-axis. The tetragonal unit cells shown in FIGS. 7B and 7D are rotated 45° around the z axis relative to the parent cubic structures shown in FIGS. 7A and 7D, respectively. Most PMA Heuslers have a tetragonal lattice constant, a (defined in FIG. 7B)<3.99 Å. As one non-limiting example, for perfect lattice matching to a PMA Heusler with in-plane lattice constant a, an appropriate choice of spacer would be (using Vegard's law): $(Na_{1-x}Li_x)$ Cl or $Na(Cl_{1-y}F_y)$, where $x \sim (3.99-a)/0.36$ or $y \sim (3.99-a)/1.01$.

Figure 3:
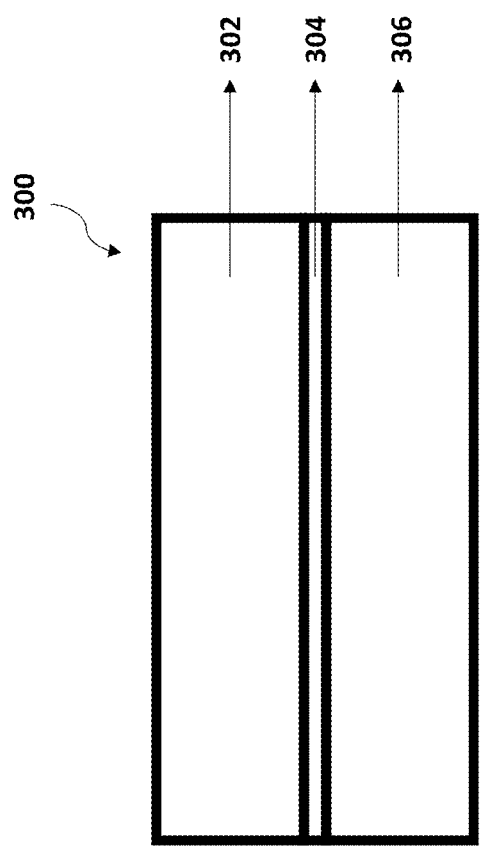
FIGS. 3 and 4 depict non-limiting examples structures formed according to the teachings of the present invention.

FIG. 3 depicts a non-limiting example of a structure formed according to the teachings of the present invention. Device 300 comprising: a first magnetic layer 302, a tunnel barrier 304 underlying the first magnetic layer 302 (made from, for example, a $Co_2MnSi$ Heusler alloy or a tetragonally distorted perpendicularly magnetized (PMA) Heusler alloy); and a second magnetic layer 306 (made from, for example, a $Co_2MnSi$ Heusler alloy or a tetragonally distorted perpendicularly magnetized (PMA) Heusler alloy) underlying the tunnel barrier 304, wherein the first magnetic layer 302, the tunnel barrier 304, and the second magnetic layer 306 are in proximity with each other, such that they form a magnetic tunnel junction. Tunnel barrier 304 may be a metal tunnel barrier and is composed of any one of, or a combination of, NaF, NaCl, NaBr, LiF, LiCl, and LiBr. At least one of the magnetic layers 302, 306 may be formed from a Heusler alloy (ideally a tetragonally distorted Heusler alloy that exhibits PMA). In one embodiment, tunnel barrier 304 is lattice matched to within 5% of both the first magnetic layer 302 and second magnetic layer 306. Upper bound of 5% is picked in this embodiment since $Co_2MnSi$ and MgO are lattice mismatched by ~5%. Also, the upper bound of 5% refers to the tunnel barrier's lattice constant being within 5% of the lattice constants associated with the first and/or second magnetic layer.

Figure 4:
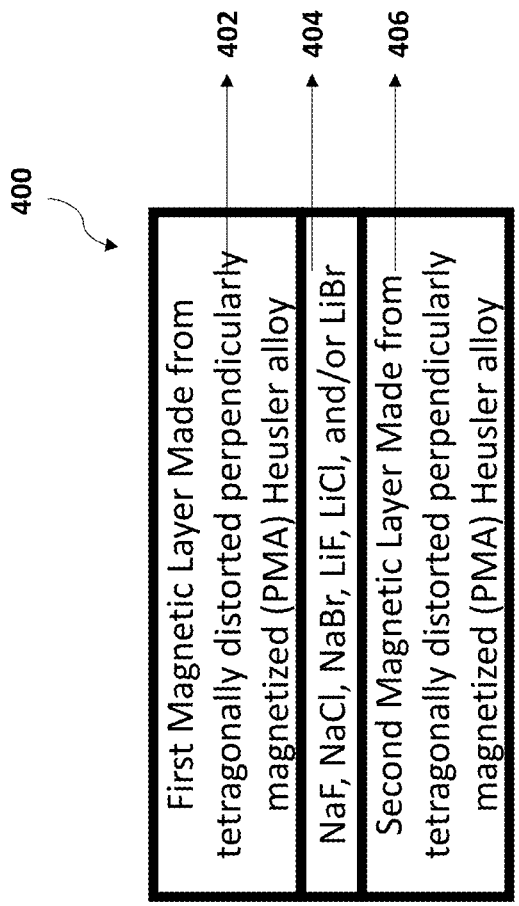

FIG. 4 depicts another non-limiting example of a structure formed according to the teachings of the present invention. Device 400 comprising a first magnetic layer made of a tetragonally distorted perpendicularly magnetized (PMA) Heusler alloy 402 (nonlimiting examples include, $Mn_3Ga$, $Mn_3Ge$); a second magnetic layer made of a tetragonally distorted perpendicularly magnetized (PMA) Heusler alloy 406 (nonlimiting examples include, $Mn_3Ga$, $Mn_3Ge$); and a metal halide tunnel barrier 404 composed of any one of, or a combination of, NaF, NaCl, NaBr, LiF, LiCl, and LiBr. Metal halide tunnel barrier 404 is disposed between the first magnetic layer made of a tetragonally distorted perpendicularly magnetized (PMA) Heusler alloy 406 and the second magnetic layer made of a tetragonally distorted perpendicularly magnetized (PMA) Heusler alloy 402. The first magnetic layer 402 made of a tetragonally distorted perpendicularly magnetized (PMA) Heusler alloy, the metal halide tunnel barrier 404, and the second magnetic layer made of a tetragonally distorted perpendicularly magnetized (PMA) Heusler alloy 406 are in proximity with each other, such that they form a magnetic tunnel junction.

Tetragonally distorted Heusler Alloys, such as $Mn_3Ga$, $Mn_3Ge$, etc., are used in the first and second magnetic layer where the halide tunnel barrier with appropriate stoichiometry modification/engineering (using Vegard's law) will lattice match the tetragonally distorted PMA Heuslers to within a pre-determined upper limit, e.g., 5%. One of the ways of obtaining the correct stoichiometry of the barrier would be: $(Na_{1-x},Li_x)Cl$ or $Na(Cl_{1-y},F_y)$, where x·(3.99−a)/0.36 or y~(3.99−a)/1.01, where a is the in-plane lattice constant of the tetragonally distorted PMA Heusler as indicated in FIGS. 7B and 7D.

Figure 5:
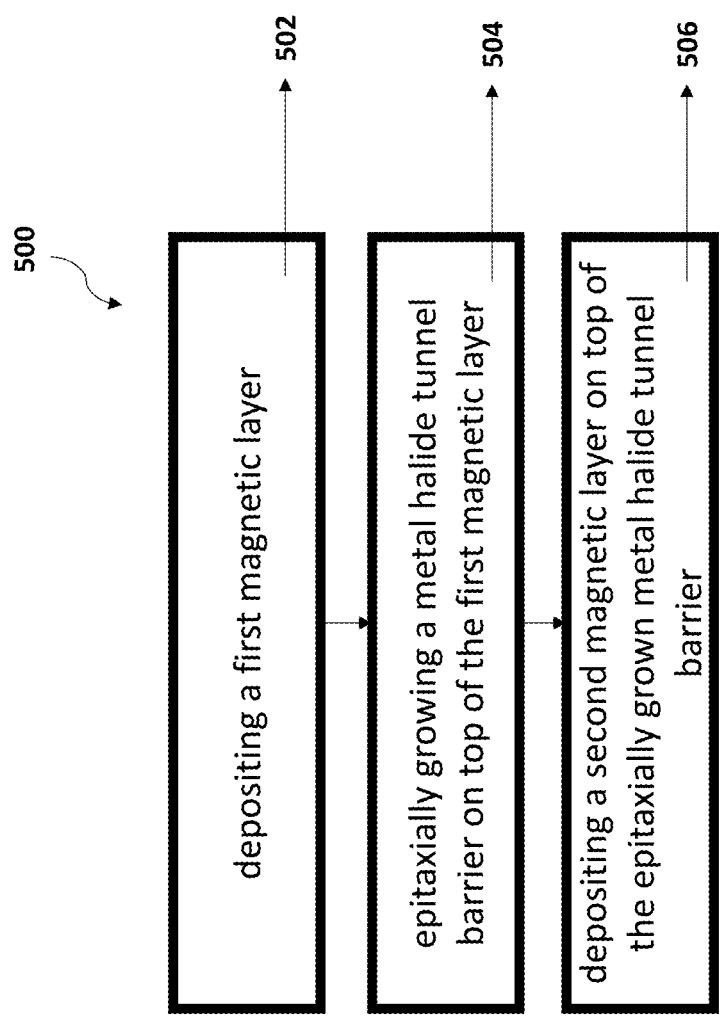
FIGS. 5 and 6 depict non-limiting examples of the present invention invention's method to manufacture a halide-based tunneling interface.

FIG. 5 depicts another non-limiting example of the present invention's method to manufacture a halide-based tunneling interface. Method 500 comprises the steps of: depositing a first magnetic layer (made from, for example, a $Co_2MnSi$ Heusler alloy or a tetragonally distorted perpendicularly magnetized (PMA) Heusler alloy such as $Mn_3Ga$, $Mn_3Ge$, etc.) 502, epitaxially growing a metal halide tunnel barrier (e.g., NaF, NaCl, NaBr, LiF, LiCl, and LiBr) on top of the first magnetic layer 504, and depositing a second magnetic layer (made from, for example, a $Co_2MnSi$ Heusler alloy or a tetragonally distorted perpendicularly magnetized (PMA) Heusler alloy such as $Mn_3Ga$, $Mn_3Ge$, etc.) on top of the epitaxially grown metal halide tunnel barrier 506. The halide tunnel barrier is lattice matched within a pre-determined upper limit, such as 5%, of both the first and second magnetic layers.

Figure 6:
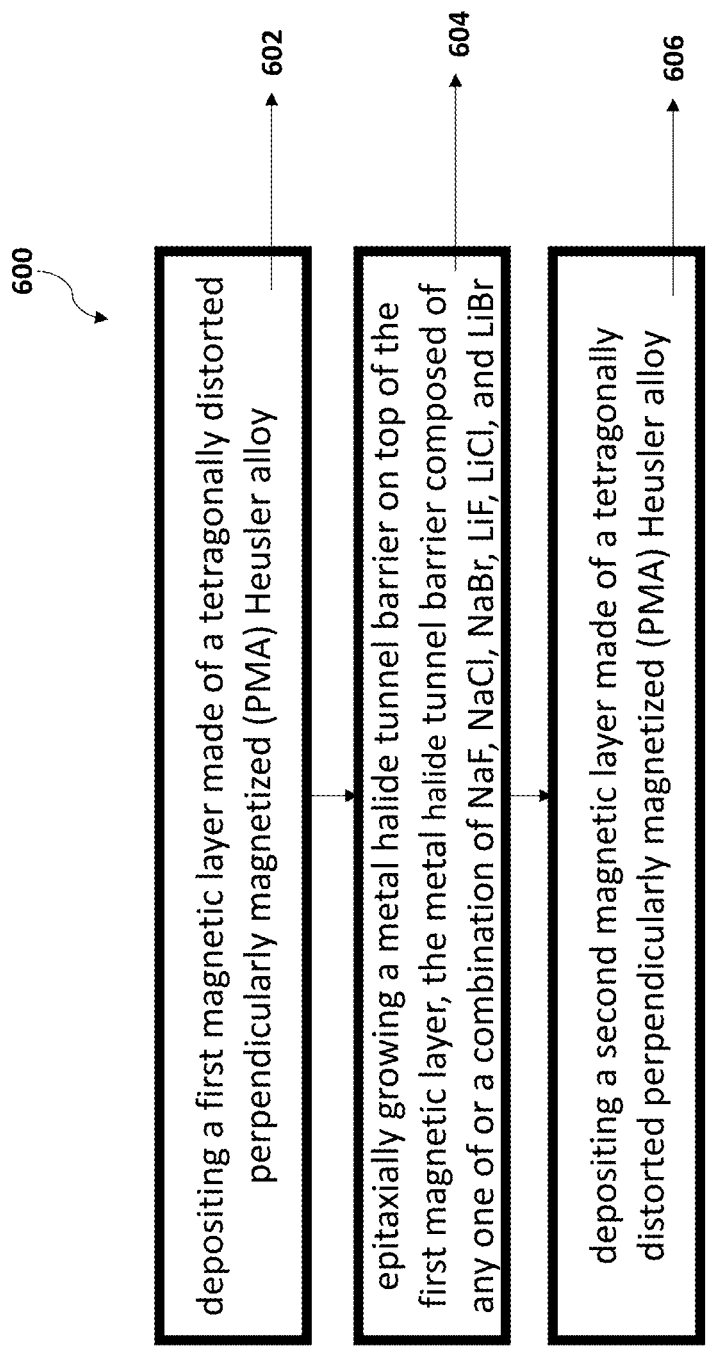

FIG. 6 depicts another non-limiting example of the present invention's method to manufacture another halide-based tunneling interface. Method 600 comprises the steps of depositing a first magnetic layer made of a tetragonally distorted perpendicularly magnetized (PMA) Heusler alloy such as $Mn_3Ga$, $Mn_3Ge$, etc. 602, epitaxially growing a metal halide tunnel barrier on top of the first magnetic layer, the metal halide tunnel barrier composed of any one of, or a combination of, NaF, NaCl, NaBr, LiF, LiCl, and LiBr 604, and depositing a second magnetic layer made of a tetragonally distorted perpendicularly magnetized (PMA) Heusler alloy such as $Mn_3Ga$, $Mn_3Ge$, etc. on top of the epitaxially grown metal halide tunnel barrier 606. The metal halide tunnel barrier is lattice matched within a pre-determined upper limit, such as 5%, of both the first and second magnetic layers.

In one embodiment, the halide tunnel barrier is grown on the first magnetic layer via Radio Frequency (RF) sputtering. Radio Frequency Sputtering is the technique involved in alternating the electrical potential of the current in the vacuum environment at radio frequencies to avoid a charge building up on certain types of sputtering target materials, which over time can result in arcing into the plasma that spews droplets creating quality control issues on the thin films—and can even lead to the complete cessation of the sputtering of atoms terminating the process. Since the present invention requires insulating halides, RF sputtering would be an effective choice.

In another embodiment, the halide tunnel barrier is grown on the first magnetic layer via Molecular Beam Epitaxy (MBE). In one embodiment, MBE takes place in high vacuum or ultra-high vacuum ($10^{-8}$-$10^{-12}$ Torr). The deposition rate in MBE (typically less than 3,000 nm per hour) allows the films to grow epitaxially. The absence of carrier gases, as well as the ultra-high vacuum environment, result in the highest achievable purity of the grown films. Since the present invention requires insulating halides (and since we are dealing with relatively lower melting temperatures of ~1,000° C. as compared to MgO that has a melting temperature of ~2850° C.), MBE will be another effective choice.

CONCLUSION

Embodiments, described above, show an effective implementation of lattice matched tunnel barriers for perpendicularly magnetized Heusler alloys. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A device comprising a first magnetic layer, a second magnetic layer, and a metal halide tunnel barrier between the first and second magnetic layers, wherein the metal halide tunnel barrier is lattice matched to within 5% of both the first and second magnetic layers, and wherein the first layer, the second layer, and the tunnel barrier are in proximity with each other so that spin-polarized current can pass from one of the magnetic layers to the other of the magnetic layers.

2. The device of claim 1, wherein the first magnetic layer is a $Co_2MnSi$ Heusler alloy or a tetragonally distorted perpendicularly magnetized (PMA) Heusler alloy.

3. The device of claim 1, wherein the second magnetic layer is a $Co_2MnSi$ Heusler alloy or a tetragonally distorted perpendicularly magnetized (PMA) Heusler alloy.

4. The device of claim 1, wherein each of the first and second magnetic layers is a $Co_2MnSi$ Heusler alloy or a tetragonally distorted perpendicularly magnetized (PMA) Heusler alloy.

5. The device of claim 1, wherein the metal halide tunnel barrier includes an alkali component and at least one halide component.

6. The device of claim 5, wherein the alkali component is any of, or a combination of, the following: Na and Li.

7. The device of claim 5, wherein the halide component is any of, or a combination of, the following: F, Cl, and Br.

8. The device of claim 1, wherein the halide tunnel barrier is any of, or a combination of, the following: NaF, NaCl, NaBr, LiF, LiCl, and LiBr.

9. A method of forming the device of claim 1 comprising the steps of:
depositing the first magnetic layer;
epitaxially growing the metal halide tunnel barrier on top of the first magnetic layer, and
depositing the second magnetic layer on top of the epitaxially grown halide tunnel barrier.

10. The method of claim 9, wherein the step of depositing the first magnetic layer comprises depositing either a $Co_2MnSi$ Heusler alloy layer or a tetragonally distorted perpendicularly magnetized (PMA) Heusler alloy layer.

11. The method of claim 9, wherein the step of depositing the second magnetic layer comprises depositing either a $Co_2MnSi$ Heusler alloy layer or a tetragonally distorted perpendicularly magnetized (PMA) Heusler alloy layer.

12. The method of claim 9, wherein the step of depositing the first magnetic layer comprises depositing either a $Co_2MnSi$ Heusler alloy layer or a tetragonally distorted perpendicularly magnetized (PMA) Heusler alloy layer, and the step of depositing the second magnetic layer comprises depositing either another $Co_2MnSi$ Heusler alloy layer or another tetragonally distorted perpendicularly magnetized (PMA) Heusler alloy layer.

13. The method of claim 9, wherein the metal halide tunnel barrier includes an alkali component and at least one halide component.

14. The method of claim 13, wherein the alkali component is any of, or a combination of, the following: Na and Li.

15. The method of claim 13, wherein the halide component is any of, or a combination of, the following: F, Cl, and Br.

16. The method of claim 9, wherein the step of epitaxially growing the halide tunnel barrier comprises any of, or a combination of, the following: epitaxially growing a NaF tunnel barrier, epitaxially growing a NaCl tunnel barrier, epitaxially growing a NaBr tunnel barrier, epitaxially growing a LiF tunnel barrier, epitaxially growing a LiCl tunnel barrier, and epitaxially growing a LiBr barrier.

17. The method of claim 9, wherein the step of epitaxially growing the halide tunnel barrier is done via RF sputtering.

18. The method of claim 9, wherein the step of epitaxially growing the halide tunnel barrier is done via evaporation.

19. A device comprising:
a first magnetic layer;
a metal halide tunnel barrier underlying the first magnetic layer; and
a second magnetic layer underlying the tunnel barrier, wherein:
the first magnetic layer, the metal halide tunnel barrier, and the second magnetic layer are in proximity with each other, such that they form a magnetic tunnel junction,
the metal halide tunnel barrier is composed of any one of, or a combination of, NaF, NaCl, NaBr, LiF, LiCl, and LiBr, and
at least one of the magnetic layers is formed from a Heusler alloy.

20. The device of claim 19, wherein the metal halide tunnel barrier and the Heusler layer are lattice matched to within 5%.

21. The device of claim 19, wherein the first magnetic layer is a $Co_2MnSi$ Heusler alloy or a tetragonally distorted perpendicularly magnetized (PMA) Heusler alloy.

22. The device of claim 19, wherein the second magnetic layer is a $Co_2MnSi$ Heusler alloy or a tetragonally distorted perpendicularly magnetized (PMA) Heusler alloy.

23. The device of claim 19, wherein each of the first and second magnetic layers is a $Co_2MnSi$ Heusler alloy or a tetragonally distorted perpendicularly magnetized (PMA) Heusler alloy.

24. A method of forming the device of claim 19 comprising the steps of:
depositing the second magnetic layer made of a tetragonally distorted perpendicularly magnetized (PMA) Heusler alloy;
epitaxially growing the metal halide tunnel barrier on top of the second magnetic layer, the metal halide tunnel barrier composed of any one of or a combination of NaF, NaCl, NaBr, LiCl, and LiBr, and
depositing the first magnetic layer made of a tetragonally distorted perpendicularly magnetized (PMA) Heusler alloy on top of the epitaxially grown metal halide tunnel barrier,
wherein the metal halide tunnel barrier is lattice matched to within 5% of both the first and second magnetic layers.

25. The method of claim 24, wherein the step of epitaxially growing the metal halide tunnel barrier is done via RF sputtering.

26. The method of claim 24, wherein the step of epitaxially growing the metal halide tunnel barrier is done via evaporation.

* * * * *